(12) United States Patent
Hanaoka

(10) Patent No.: US 10,156,779 B2
(45) Date of Patent: *Dec. 18, 2018

(54) ELECTRO-OPTICAL DEVICE, METHOD OF MANUFACTURING ELECTRO-OPTICAL DEVICE, AND ELECTRONIC APPARATUS

(71) Applicant: SEIKO EPSON CORPORATION, Tokyo (JP)

(72) Inventor: Terunao Hanaoka, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/856,675

(22) Filed: Dec. 28, 2017

(65) Prior Publication Data

US 2018/0120681 A1  May 3, 2018

Related U.S. Application Data

(60) Continuation of application No. 15/259,937, filed on Sep. 8, 2016, now Pat. No. 9,885,945, which is a
(Continued)

(30) Foreign Application Priority Data

Mar. 27, 2015  (JP) .................................. 2015-065935

(51) Int. Cl.
*G02B 26/08*  (2006.01)
*G03B 21/16*  (2006.01)
(Continued)

(52) U.S. Cl.
CPC ............... *G03B 21/16* (2013.01); *B81B 3/00* (2013.01); *G02B 26/0833* (2013.01); *G02B 26/0841* (2013.01); *G03B 21/008* (2013.01)

(58) Field of Classification Search
CPC ............ G02B 26/0841; G02B 26/0833; G03B 21/16; G03B 21/008; B81B 3/00; B81B 7/008; B81C 7/0051; B81C 1/00301
(Continued)

(56) References Cited

U.S. PATENT DOCUMENTS 6,639,313 B1 * 10/2003 Martin .................. B81B 7/0051
257/432
6,894,853 B2  5/2005 Haskett et al.
(Continued)

FOREIGN PATENT DOCUMENTS

JP  2004-209585 A  7/2004

OTHER PUBLICATIONS

Jul. 7, 2016 Notice of Allowance issued in U.S. Appl. No. 15/017,746.
(Continued)

*Primary Examiner* — Euncha Cherry
(74) *Attorney, Agent, or Firm* — Oliff PLC

(57) ABSTRACT

In an electro-optical device, a light-transmitting cover is disposed in mirrors, and when light is applied toward the mirrors through the light-transmitting cover, the temperature of the light-transmitting cover tires to increase due to the applied light. Here, in the electro-optical device, first metal portions that are in contact with the light-transmitting cover and the element substrate are formed. For this reason, it is possible to release the heat of the light-transmitting cover to a substrate through the first metal portions and the element substrate.

7 Claims, 15 Drawing Sheets

Related U.S. Application Data division of application No. 15/017,746, filed on Feb. 8, 2016, now Pat. No. 9,465,210.

(51) Int. Cl.
  G03B 21/00 (2006.01)
  B81B 3/00 (2006.01)

(58) Field of Classification Search
  USPC ..................................................... 359/225.1
  See application file for complete search history.

(56) References Cited

U.S. PATENT DOCUMENTS

| | | | |
|---|---|---|---|
| 7,456,497 B2 | 11/2008 | Higashi | |
| 7,898,724 B2 | 3/2011 | Liu et al. | |
| 8,164,180 B2 * | 4/2012 | Sato | B81C 1/00301 |
| | | | 257/415 |
| 8,216,884 B2 | 7/2012 | Higashi | |
| 2005/0167795 A1 | 8/2005 | Higashi | |
| 2009/0068795 A1 | 3/2009 | Higashi | |
| 2015/0069358 A1 * | 3/2015 | Chida | H01L 51/5246 |
| | | | 257/40 |

OTHER PUBLICATIONS

Sep. 28, 2017 Notice of Allowance issued in U.S. Appl. No. 15/259,937.

* cited by examiner

ELECTRO-OPTICAL DEVICE, METHOD OF MANUFACTURING ELECTRO-OPTICAL DEVICE, AND ELECTRONIC APPARATUS

This application is a continuation application of U.S. application Ser. No. 15/259,937 filed Sep. 8, 2016 (now U.S. Pat. No. 9,885,945), which is a divisional application of application Ser. No. 15/017,746 filed Feb. 8, 2016 (now U.S. Pat. No. 9,465,210), which claims priority to JP 2015-065935 filed Mar. 27, 2015, the disclosures of which are hereby incorporated by reference herein in their entirety.

BACKGROUND

1. Technical Field

The present invention relates to a method of manufacturing an electro-optical device including a mirror, an electro-optical device, and an electronic apparatus.

2. Related Art

As an electronic apparatus, there has been known, for example, a projective display apparatus that displays an image on a screen by modulating light emitted from a light source by a plurality of mirrors (micromirrors) of an electro-optical device called a digital mirror device (DMD) and then enlargedly projecting the modulated light by a projection optical system. For example, the electro-optical device used in the projective display apparatus includes an element substrate 1 provided with mirrors 50 on one surface 1s, spacers 28 adhering to the one surface 1s of the element substrate 1 so as to surround the mirrors 50 in planar view, and a plate-shaped light-transmitting cover 29 that is supported by ends of the spacer 28 opposite to the element substrate 1, as shown in FIG. 18. For example, the electro-optical device includes a sealing substrate 90 on which a concave-shaped substrate mounting portion 93 surrounded by a sidewall 92 is formed, and the element substrate 1 is fixed to the bottom of the substrate mounting portion 93 by an adhesive layer 97, and is sealed by a sealing resin 98 such as an epoxy-based material provided in the substrate mounting portion 93.

In the electro-optical device having the aforementioned configuration, light transmits through the light-transmitting cover 29, and is incident on the mirrors 50. Light reflected from the mirrors 50 transmits through the light-transmitting cover 29, and is emitted. For this reason, the temperature of the light-transmitting cover 29 is increased due to the applied light. Since such a temperature rise leads to the temperature rise of the electro-optical device, there is a concern that the malfunction or the life reduction of the electro-optical device occurs.

Meanwhile, as a method of increasing the thermal radiation properties of a device mounted on a substrate, it is conceivable to provide a technology of widening the contact area of the device and the sealing resin (see U.S. Pat. No. 7,898,724 B2). For example, as shown in FIG. 18, the front surface of the sealing resin 98 is in contact with the light-transmitting cover 29 in a position higher than a position where the front surface of the sealing resin 98 is in contact with the sidewall 92 of the sealing substrate 90. In such a configuration, it is possible to increase the transmission efficiency of heat to the sealing resin 98 from the light-transmitting cover 29.

However, even though the transmission efficiency of the heat to the sealing resin 98 from the light-transmitting cover 29 is increased by the configuration shown in FIG. 18, since the transmission efficiency of the sealing resin 98 is low, there is a problem that it is difficult to sufficiently suppress the temperature rise of the element substrate 1.

SUMMARY

An advantage of some aspects of the invention is to provide an electro-optical device, a method of manufacturing an electro-optical device, and an electronic apparatus which are capable of more efficiently releasing the heat of a light-transmitting cover disposed on a side on which light is applied to mirrors.

An electro-optical device according to an aspect of the invention includes: a substrate; an element substrate that is mounted on the substrate; a mirror that is provided on a first surface of the element substrate; a drive element that is provided on the first surface of the element substrate to drive the mirrors; a light-transmitting cover that has light transmitting properties, and is provided such that the mirror is positioned between the light-transmitting cover and the element substrate; and a first metal portion that is in contact with the element substrate and the light-transmitting cover.

In the aspect of the invention, a case where one member is "in contact with" another member is not limited to a case where the members are directly in contact with each other, but includes a case where the members are in contact with each other through a layer such as an adhesive layer capable of being substantially ignored in view of thermal conduction.

In the electro-optical device according to the invention, the light transmits through the light-transmitting cover, and is incident on the mirror. Light reflected from the mirrors transmits through the light-transmitting cover, and is emitted. For this reason, the temperature of the light-transmitting cover tries to increase due to the applied light. Meanwhile, in the electro-optical device according to the invention, since the first metal portion in contact with the light-transmitting cover and the element substrate are formed, it is possible to more efficiently release the heat of the light-transmitting cover through the first metal portion, the element substrate and the substrate. Accordingly, since the temperature rise of the electro-optical device can be suppressed, it is possible to suppress the malfunction or the life reduction of the electro-optical device.

In the aspect of the invention, it is preferable that the first metal portion is formed in a frame shape that surrounds the periphery of the mirrors in planar view. In such a configuration, it is possible to more efficiently release the heat of the light-transmitting cover through the first metal portion, the element substrate and the substrate.

In the aspect of the invention, it is preferable that the electro-optical device further includes a second metal portion that is in contact with the substrate and the light-transmitting cover. In such a configuration, it is possible to more efficiently release the heat of the light-transmitting cover to the substrate through the second metal portion. Accordingly, since the temperature rise of the electro-optical device can be suppressed, it is possible to suppress the malfunction or the life reduction of the electro-optical device.

The aspect of the invention may adopt a configuration in which the second metal portion is a metal frame that is fixed to the light-transmitting cover and the substrate.

In the aspect of the invention, it is preferable that the second metal portion is further in contact with the first metal portion. In such a configuration, it is possible to release the heat to the second metal portion from the first metal portion, and it is possible to release the heat to the first metal portions from the second metal portion.

The aspect of the invention may adopt a configuration in which the first metal portion is in contact with an end of the light-transmitting cover close to the element substrate and the first metal portion is in contact with the element substrate.

The aspect of the invention may adopt a configuration in which the first metal portion is in contact with a lateral surface of the light-transmitting cover and the first metal portion is in contact with the element substrate.

The aspect of the invention may adopt a configuration in which the first metal portion is a metal layer that surrounds a resin portion protruding from the first surface of the element substrate.

The aspect of the invention may adopt a configuration in which the electro-optical device further includes a sealing resin that is in contact with a lateral surface of the element substrate and a lateral surface of the light-transmitting cover between the second metal portion and the substrate. In such a configuration, it is possible to release the heat of the light-transmitting cover or the element substrate through the sealing resin. It is possible to prevent moisture from infiltrating into a portion where the mirror is provided by using the sealing resin.

The aspect of the invention may adopt a configuration in which the electro-optical device further includes a sealing resin that is in contact with a lateral surface of the element substrate and a lateral surface of the light-transmitting cover; and a light-transmitting inorganic material layer that is laminated on a surface of the light-transmitting cover opposite to a surface of the light-transmitting cover facing the mirror and a surface of the sealing resin opposite to a surface of the sealing resin facing the substrate, and is in contact with the substrate. In such a configuration, it is possible to release the heat of the light-transmitting cover or the element substrate through the sealing resin and the inorganic material layer. It is possible to prevent moisture from infiltrating by using the inorganic material layer and the sealing resin.

A method of manufacturing an electro-optical device according to an aspect of the invention includes providing a light-transmitting cover having light transmitting properties on an element substrate that includes a mirror and a drive element which drives the mirrors on a first surface, the mirror being positioned between the light-transmitting cover and the element substrate, and the light-transmitting cover being provided such that a first metal portion is in contact with the light-transmitting cover and the element substrate; and mounting the element substrate on a substrate.

The method of manufacturing an electro-optical device according to the aspect of the invention may adopt a configuration in which the first metal portion is formed on the element substrate before the providing of the light-transmitting cover on the element substrate, and in the providing of the light-transmitting cover on the element substrate, when the light-transmitting cover is provided, the light-transmitting cover may be in contact with the first metal portion.

The method of manufacturing an electro-optical device according to the aspect of the invention may adopt a configuration in which the first metal portion is formed on the light-transmitting cover before the providing of the light-transmitting cover on the element substrate, and in the providing of the light-transmitting cover on the element substrate, when the light-transmitting cover is provided, the element substrate may be in contact with the first metal portion.

In the method of manufacturing an electro-optical device according to the aspect of the invention, it is preferable that the method further includes bringing a second metal portion into contact with the light-transmitting cover and the substrate.

In the method of manufacturing an electro-optical device according to the aspect of the invention, a second metal portion may be formed on the light-transmitting cover before the providing of the light-transmitting cover on the element substrate, and in the providing of the light-transmitting cover on the element substrate, when the light-transmitting cover is provided, the substrate may be in contact with the second metal portion.

In the aspect of the invention, it is preferable that when the substrate is in contact with the second metal portion, the first metal portion is in contact with the second metal portion.

The electro-optical device to which the invention is applied can be used in various electronic apparatuses, and in this case, a light source unit that applies light-source light to the mirror is provided in the electronic apparatus. When a projective display apparatus is used as the electronic apparatus, a projection optical system that projects light modulated by the mirror is further provided in the electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
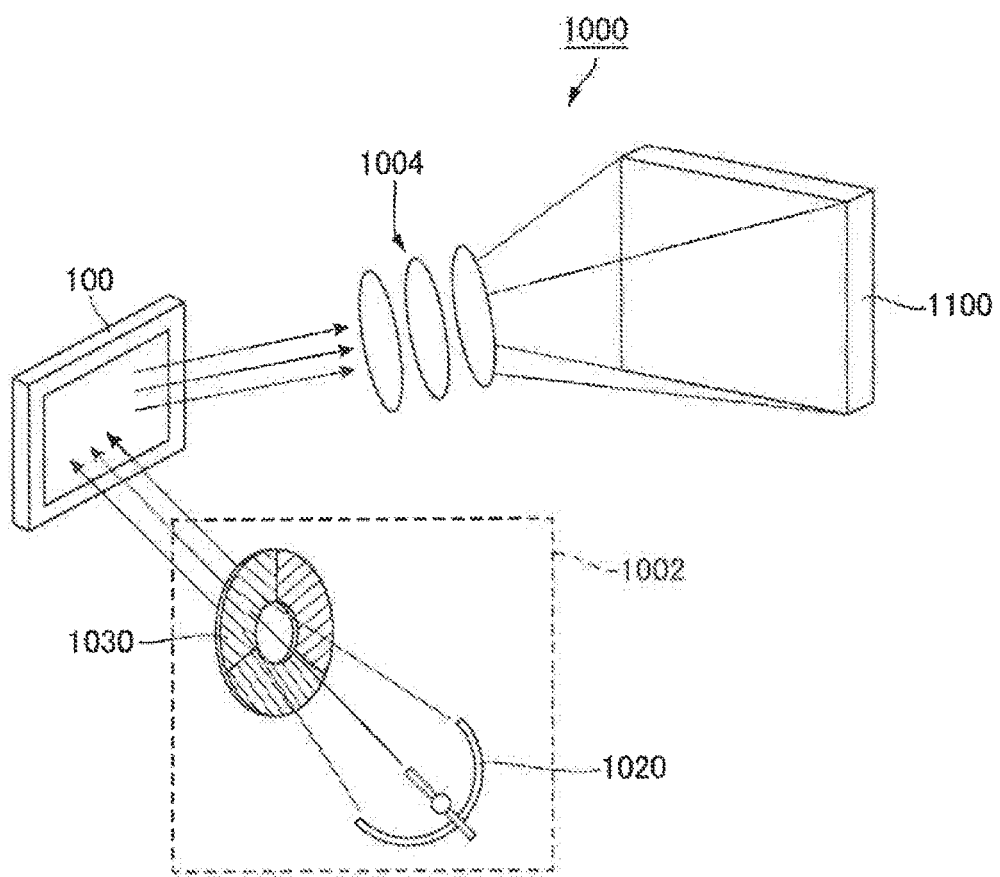
FIG. 1 is a schematic diagram showing an optical system of a projective display apparatus as an electronic apparatus to which the invention is applied.

Embodiments of the invention will be described with reference to the drawings. In the following description, a projective display apparatus will be described as an electronic apparatus to which the invention is applied. In the drawings referred to in the following description, the respective layers or the respective members are illustrated so as to have the size capable of being recognized in the drawings, and thus, different scales are applied to each layer and each member. The number of mirrors shown in the drawings is set such that the mirrors are illustrated so as to have the size capable of being recognized in the drawings, but more mirrors than the number of mirrors shown in the drawings may be provided. In the following embodiments, it is assumed that a case where it is described that a member is "arranged close to a first surface" may include a case where the member is arranged so as to be in contact with the first surface, a case where the member is arranged on the first surface through another component, a case where the member is partially in contact with the first surface, and a case where the member is partially arranged through another component.

Embodiment 1

Projective Display Apparatus as Electronic Apparatus

FIG. 1 is a schematic diagram showing an optical system of a projective display apparatus as an electronic apparatus to which the invention is applied. A projective display apparatus 1000 shown in FIG. 1 includes a light source unit 1002, an electro-optical device 100 that modulates light emitted from the light source unit 1002 according to image information, and a projection optical system 1004 that projects light modulated in the electro-optical device 100 as a projection image onto a projected object 1100 such as a screen. The light source unit 1002 includes a light source 1020, and a color filter 1030. The light source 1020 emits white light, the color filter 1030 emits color light beams with rotation, and the electro-optical device 100 modules incident light at a timing synchronized with the rotation of the color filter 1030. Instead of the color filter 1030, a fluorescent substrate that converts the light emitted from the light source 1020 into color light beams may be used. The light source unit 1002 and the electro-optical device 100 may be provided for each color light beam.

Basic Configuration of Electro-Optical Device 100

Figure 2A:
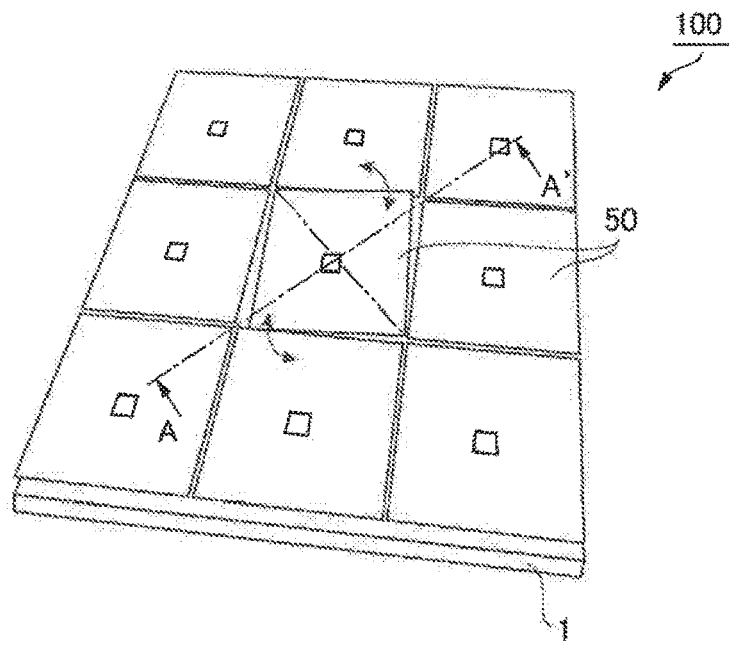
FIGS. 2A and 2B are schematic explanatory diagrams showing a basic configuration of an electro-optical device to which the invention is applied.
Figure 2B:
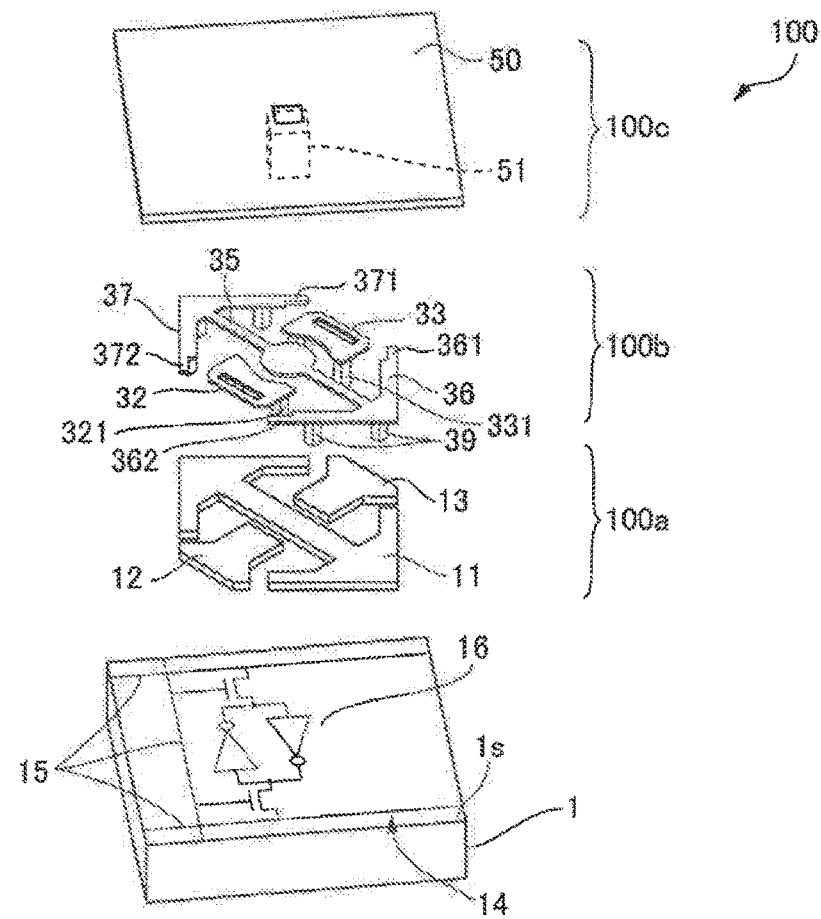
Figure 3A:
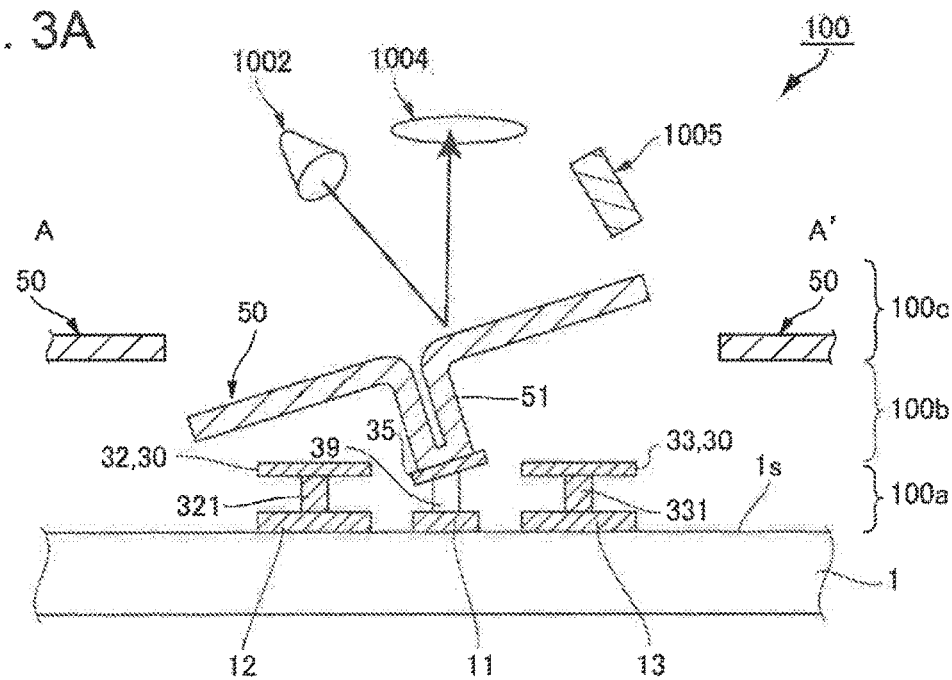
FIGS. 3A and 3B are schematic explanatory diagrams showing an A-A' section of a major part of the electro-optical device to which the invention is applied.
Figure 3B:
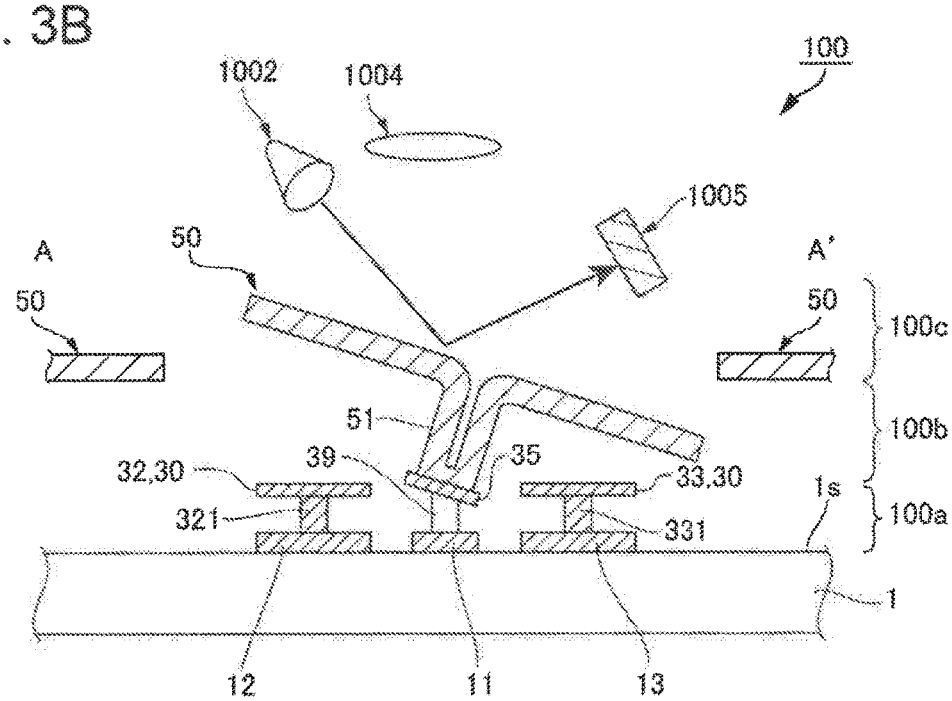

FIGS. 2A and 2B are schematic explanatory diagrams showing a basic configuration of the electro-optical device 100 to which the invention is applied, and FIGS. 2A and 2B are an explanatory diagram showing a major part of the electro-optical device 100 and an exploded perspective view of the major part of the electro-optical device 100, respectively. FIGS. 3A and 3B are schematic explanatory diagrams showing an A-A' section of the major part of the electro-optical device 100 to which the invention is applied, and FIGS. 3A and 3B are a schematic explanatory diagram showing a state where a mirror tilts to one side and a schematic explanatory diagram showing a state where the mirror tilts to the other side, respectively.

As shown in FIGS. 2A to 3B, in the electro-optical device 100, a plurality of mirrors 50 is arranged close to one surface 1s (a first surface) of an element substrate 1 in the form of matrix, and the mirrors 50 are separated from the element substrate 1. The element substrate is, for example, a silicon substrate. The mirror 50 is a micromirror having a plane size of which one side has a length of, for example, 10 to 30 μm. The mirrors 50 are arranged in, for example, an array of 800×600 to 1028×1024, and one mirror 50 corresponds to one pixel of an image.

The front surface of the mirror 50 is a reflection surface made of a metal reflection film such as aluminum. The electro-optical device 100 includes a first layer portion 100a that includes a substrate-side bias electrode 11 and substrate-side address electrodes 12 and 13 formed on the one surface 1s of the element substrate 1, a second layer portion 100b that includes overhead address electrodes 32 and 33 and a hinge 35, and a third layer portion 100c that includes the mirrors 50. In the first layer portion 100a, an address designation circuit 14 is formed on the element substrate 1. The address designation circuit 14 includes memory cells for selectively controlling the operations of the mirrors 50, word lines, and interconnections 15 such as bit lines, and includes a circuit configuration similar to a random access memory (RAM) including a CMOS circuit 16.

The second layer portion 100b includes the overhead address electrodes 32 and 33, the hinge 35, and a mirror post 51. The overhead address electrodes 32 and 33 are electrically conducted to the substrate-side address electrodes 12 and 13 through electrode posts 321 and 331, and are supported by the substrate-side address electrodes 12 and 13. Hinge arms 36 and 37 extend from both ends of the hinge 35. The hinge arms 36 and 37 are electrically conducted to the substrate-side bias electrode 11 through an arm post 39, and are supported by the substrate-side bias electrode 11. The mirrors 50 are electrically conducted to the hinge 35 through the mirror post 51, and are supported by the hinge 35. Accordingly, the mirrors 50 are electrically conducted to the substrate-side bias electrode 11 through the mirror post 51, the hinge 35, the hinge arms 36 and 37, and the arm post 39, and a bias voltage is applied to the mirrors from the substrate-side bias electrode 11. Stoppers 361, 362, 371 and 372 that abut onto the mirrors when the mirrors 50 tilt to prevent the mirrors 50 from being in contact with the overhead address electrodes 32 and 33 are formed at leading ends of the hinge arms 36 and 37.

The overhead address electrodes 32 and 33 serve as drive elements 30 that generate an electrostatic force between the mirror 50 and the drive element 30 to drive the mirror 50 to tilt. The substrate-side address electrodes 12 and 13 may be configured to generate an electrostatic force between the mirror 50 and the substrate-side address electrodes to drive the mirror 50 to tilt in some cases, and in this case, the drive elements 30 are the overhead address electrodes 32 and 33 and the substrate-side address electrodes 12 and 13. The hinge 35 is twisted when a drive voltage is applied to the overhead address electrodes 32 and 33 and the mirror 50 tilts so as to draw to the overhead address electrode 32 or the overhead address electrode 33 as shown in FIGS. 3A and 3B, and exerts a force for returning the mirror 50 to a posture parallel to the element substrate 1 when the applying of the drive voltage to the overhead address electrodes 32 and 33 is stopped and an attractive force for the mirror 50 is cancelled.

For example, when the mirror 50 tilts to one overhead address electrode 32 as shown in FIG. 3A, the electro-optical device 100 is in a turn-on state in which the light emitted from the light source unit 1002 is reflected toward the projection optical system 1004 by the mirror 50. By contrast, when the mirror 50 tilts to the other overhead address electrode 33 as shown in FIG. 3B, the electro-optical device is in a turn-off state in which the light emitted from the light source unit 1002 is reflected toward a light absorption device 1005 by the mirror 50, and in such a turn-off state, the light is not reflected toward the projection optical system 1004. Since such driving is performed in the plurality of mirrors 50, the light beams emitted from the light source unit 1002 are modulated into image light beams by the plurality of mirrors 50 and are projected from the projection optical system 1004, so that the image is displayed.

A plate-shaped yoke facing the substrate-side address electrodes 12 and 13 is integrally formed with the hinge 35, and drives the mirror 50 by using an electrostatic force acting between the substrate-side address electrodes 12 and 13 and the yoke in addition to the electrostatic force generated between the overhead address electrodes 32 and 33 and the mirror 50.

Entire Structure of Electro-Optical Device 100

Figure 4A:
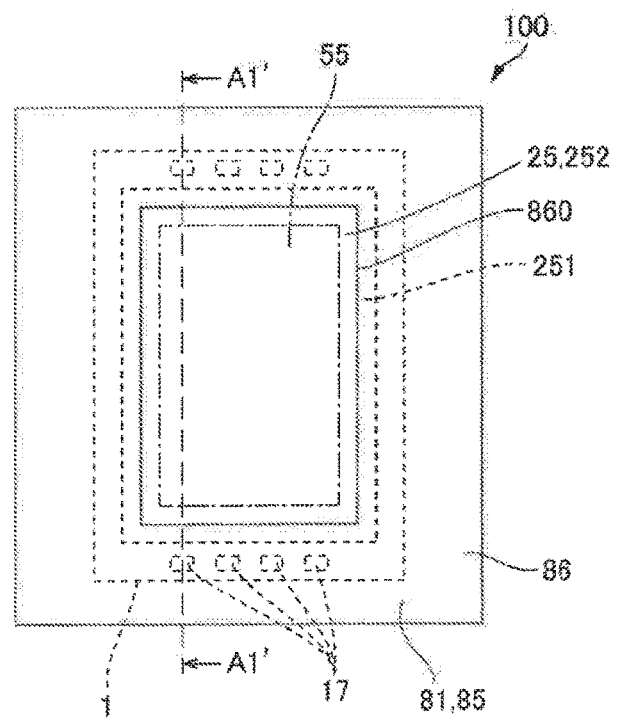
FIGS. 4A and 4B are explanatory diagrams showing an electro-optical device according to Embodiment 1 of the invention.
Figure 4B:
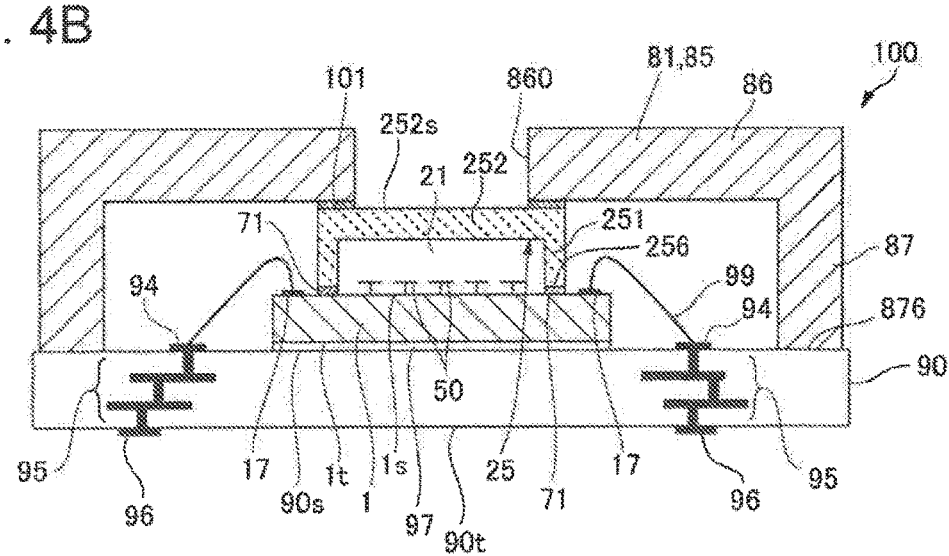

FIGS. 4A and 4B are exemplary diagrams of the electro-optical device 100 according to Embodiment 1 of the invention, and FIGS. 4A and 4b are a plan view of the electro-optical device 100 and a sectional view taken along line A1-A1', respectively.

As shown in FIGS. 4A and 4B, in the electro-optical device 100 according to the present embodiment, the element substrate 1 in which the plurality of mirrors 50 and the plurality of drive elements 30 described with reference to FIGS. 2 and 3 are formed on the one surface 1s is mounted on a mounting surface 90s of a substrate 90 made from a ceramic substrate through an adhesive layer 97 made of a silver paste after the one surface 1s is sealed by a light-transmitting cover 25. Specifically, the other surface 1t which is a side opposite to the one surface 1s of the element substrate 1 adheres to the mounting surface 90s of the substrate 90 by using the adhesive layer 97. Since the silver paste has high thermal conductivity, thermal transfer properties to the substrate 90 from the element substrate 1 are excellent.

A plurality of terminals 17 is formed at an end of the one surface 1s of the element substrate 1, which does not overlap with the mirror 50 in planar view. In the present embodiment, the terminals 17 are arranged in two rows so as to sandwich the mirror 50. Some of the plurality of terminals 17 are electrically connected to the overhead address electrodes 32 and 33 (the drive elements 30) through the address designation circuit 14 or the substrate-side address electrodes 12 and 13 described with reference to FIGS. 2A to 3B. Some of the plurality of terminals 17 are electrically connected to the mirror 50 through the address designation circuit 14, the substrate-side bias electrode 11 and the hinge 35 described with reference to FIGS. 2A to 3B. Some of the plurality of terminals 17 are electrically connected to a drive circuit provided at a front stage of the address designation circuit 14 described with reference to FIGS. 2A to 3B.

The terminals 17 are electrically connected to internal electrodes 94 formed inside the mounting surface 90s of the substrate 90 through wires 99 for wire bonding. The substrate 90 is a multilayer interconnection substrate, and the internal electrodes 94 are electrically conducted to external electrodes 96 formed on the surface 90t opposite to the mounting surface 90s through multilayer interconnection portions 95 including through holes or interconnections.

Configuration of Light-Transmitting Cover 25

The light-transmitting cover 25 having light transmitting properties includes a frame portion 251 (a spacer) that surrounds the periphery of the mirrors 50 and the drive elements (see FIGS. 2A to 3B) in planar view (for example, planar view when the element substrate 1 is viewed from the one surface 1s), and a flat plate portion 252, and a portion of the light-transmitting cover 25 where the mirror 50 is disposed is a concave portion 21. The flat plate portion 252 faces the mirror 50 on a side opposite to the element substrate 1. In other words, the flat plate portion 252 is provided such that the mirror 50 is positioned between the flat plate portion 252 and the element substrate 1. In the light-transmitting cover 25, ends 256 of the frame portion 251 close to the element substrate 1 are fixed to the element substrate 1 through first metal portion 71, to be described below. In such a state, the flat plate portion 252 faces the front surface of the mirror 50 in a position separated from the mirror 50 by a predetermined distance on the opposite side of the element substrate 1.

In the present embodiment, the light-transmitting cover 25 is made from a light-transmitting member in which the frame portion 251 and the flat plate portion 252 are integrally formed. For example, the light-transmitting cover 25 is made of light-transmitting glass in which the frame portion 251 and the flat plate portion 252 are integrally formed. For this reason, the frame portion 251 and the flat plate portion 252 are continuously connected, and there is no interface between the frame portion 251 and the flat plate portion 252.

In the electro-optical device 100 having the aforementioned configuration, after the emitted light transmits through the flat plate portion 252 and is incident on the mirror 50, the light is reflected from the mirror 50, and the light transmits through the flat plate portion 252 and is output. In the present embodiment, air may be present within the light-transmitting cover 25, or instead of air the inside of the light-transmitting cover may be filled with an inert gas, or the inside of the light-transmitting cover may be in a vacuum state.

Configuration of First Metal Portion 71

In the electro-optical device 100 of the present embodiment, the ends 256 of the frame portion 251 close to the element substrate 1 are fixed to the element substrate 1 through the first metal portion 71 between the terminals 17 and the mirror 50. Accordingly, the first metal portion 71 is in contact with the light-transmitting cover 25 and the element substrate 1. The first metal portion 71 is formed in a frame shape over the entire circumference along the ends 256 of the frame portion 251, and surround the periphery of a region 55 where the mirrors 50 are arranged in planar view (for example, planar view when the element substrate 1 is viewed from the one surface 1s). For this reason, the first metal portion 71 is in contact with the element substrate 1 and the ends 256 of the frame portion 251 over the entire circumference. The outer periphery of the region 55 shown in FIG. 4A refers to the outer periphery of the region where the plurality of mirrors 50 is formed, and the mirrors 50 may not be formed in a part of the region 55.

The first metal portion 71 is, for example, metal portion formed on the element substrate 1, and in this case, the ends 256 of the frame portion 251 adhere to the first metal portion 71 through the adhesive layer. The first metal portion 71 may be metal portions formed at the ends 256 of the frame portion 251 in some cases, and in this case, the element substrate 1 adheres to the first metal portion 71 through the adhesive layer. In the present embodiment, the first metal portion 71 is metal portions formed on the element substrate 1. For example, a silver paste is used as the adhesive layer.

Configuration of Second Metal Portion 81

A second metal portion 81 in contact with the substrate 90 and the light-transmitting cover 25 is formed in the electro-optical device 100 of the present embodiment. In the present embodiment, the second metal portion 81 is a metal frame 85 fixed onto a surface 252s (a front surface) opposite to a surface of the flat plate portion 252 of the light-transmitting cover 25 facing the mirror 50 by an adhesive layer 101. The metal frame 85 includes an end plate portion 86 facing the substrate 90, and a square body portion 87 protruding toward the substrate 90 from the outer periphery of the end plate portion 86, and an end 876 of the body portion 87 close to the substrate 90 adheres to the substrate 90 by an adhesive layer. Accordingly, the second metal portion 81 (the metal frame 85) adheres to the substrate 90. For example, a silver paste is used as the adhesive layer. The metal frame 85 is made of Kovar or copper.

An opening 860 is formed in a position of the end plate portion 86 which overlaps with the light-transmitting cover 25 in planar view. For this reason, an end of the end plate portion 86 close to the opening 860 adheres to the end of the light-transmitting cover 25 through the adhesive layer 101. Accordingly, the light-transmitting cover 25 is exposed through the opening 860 of the end plate portion 86. The end plate portion 86 is in contact with the light-transmitting cover 25 through the adhesive layer 101 over the entire circumference which surrounds the opening 860. For example, a silver paste is used as the adhesive layer 101.

Major Effects of Present Embodiment

As described above, in the electro-optical device 100 of the present embodiment, the light-transmitting cover 25 is disposed close to the mirrors 50 to which light is applied, and when light is applied toward the mirrors 50 through the light-transmitting cover 25, the temperature of the light-transmitting cover 25 tries to increase due to the applied light. Meanwhile, in the electro-optical device 100 of the present embodiment, the first metal portion 71 in contact with the light-transmitting cover 25 and the element substrate 1 is provided. For this reason, it is possible to more efficiently release the heat of the light-transmitting cover 25 through the first metal portion 71, the element substrate 1 and the substrate 90. In the electro-optical device 100, the second metal portion 81 in contact with the substrate 90 and the light-transmitting cover 25 is formed. For this reason, it is possible to more efficiently release the heat of the light-transmitting cover 25 to the substrate 90 through the second metal portion 81. Accordingly, since the temperature rise of the electro-optical device 100 can be suppressed, it is possible to suppress the malfunction or the life reduction of the electro-optical device 100.

The first metal portion 71 is in contact with the element substrate 1 and the ends 256 of the frame portion 251 over the entire circumference. For this reason, it is possible to more efficiently release the heat of the light-transmitting cover 25 through the first metal portion 71. Since the mirrors 50 are sealed by the light-transmitting cover 25, the first metal portion 71 and the element substrate 1, moisture is hard to infiltrate into a space where the mirrors 50 are arranged. Thus, when the mirrors 50 are driven, such a failure that the mirrors 50 are adsorbed onto surrounding members while tilting by water drops, and the mirrors are not moved does not easily occur.

The second metal portion 81 is the metal frame 85 adhering to the light-transmitting cover 25 and the substrate 90 over the entire circumference so as to be in contact with the light-transmitting cover and the substrate. For this reason, it is possible to seal the inside of the metal frame 85. Accordingly, moisture is hard to infiltrate into the space where the mirrors 50 are arranged. In the light-transmitting cover 25, the frame portion 251 that surrounds the periphery of the region where the mirrors 50 are arranged and the flat plate portion 252 facing the mirrors 50 are integrally formed. For this reason, a situation in which moisture infiltrates through a gap between the frame portion 251 and the flat plate portion 252 does not occur.

Method of Manufacturing Electro-Optical Device 100

A method of manufacturing the electro-optical device 100 according to Embodiment 1 of the invention will be described with reference to FIGS. 5A to 7C. FIGS. 5A to 5D are process sectional views showing the manufacturing the electro-optical device 100 according to Embodiment 1 of the invention. FIG. 6 is a plan view of a first wafer 10 used to manufacture the electro-optical device 100 according to Embodiment 1 of the invention. FIGS. 7A to 7D are process sectional views showing a process of mounting the element substrate 1 on the substrate 90 in the method of manufacturing the electro-optical device 100 according to Embodiment 1 of the invention. In FIGS. 5A to 5D, the drive elements 30 are not illustrated, and a case where the number of mirrors 50 is less than that in FIG. 4B and two mirrors 50 are formed on one element substrate 1.

Figure 5A:
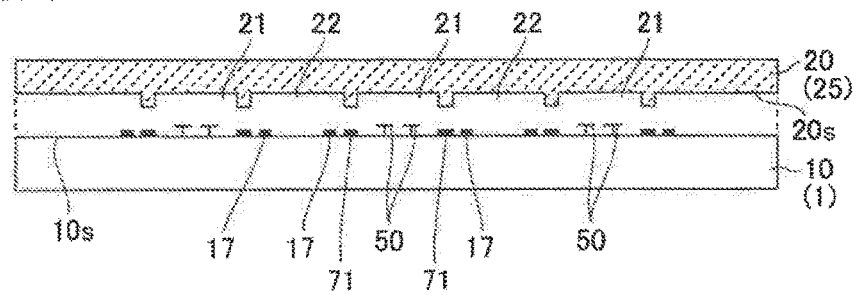
FIGS. 5A to 5D are process sectional views showing a method of manufacturing the electro-optical device according to Embodiment 1 of the invention.
Figure 6:
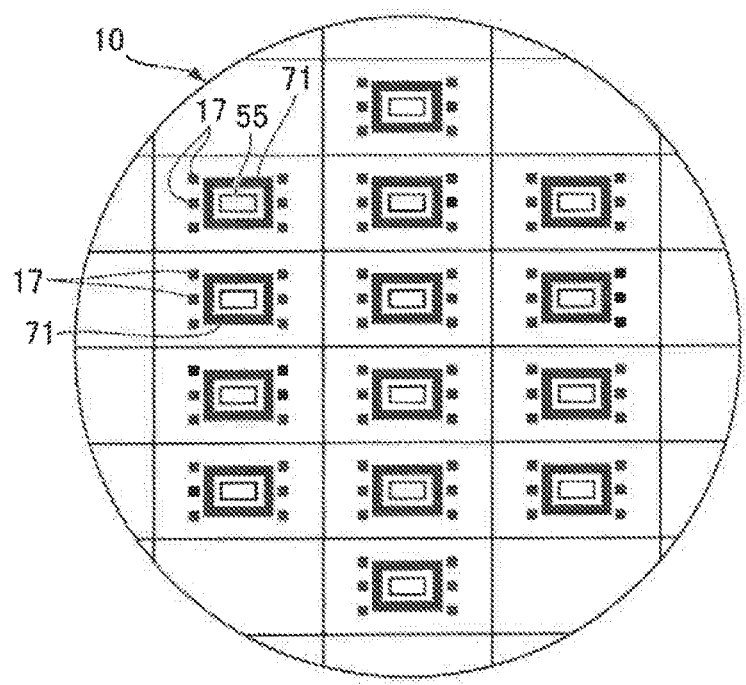
FIG. 6 is a plan view of a first wafer used in manufacturing the electro-optical device according to Embodiment 1 of the invention.

As shown in FIG. 5A and FIG. 6, in order to manufacture the electro-optical device 100 of the present embodiment, in a first wafer preparing process, a large-sized first wafer 10 is prepared. The mirrors 50 and the terminals 17 are formed on one surface 10s (a first surface) of the first wafer 10 (a silicon wafer) from which a plurality of element substrates 1 can be obtained for each region where the element substrates 1 are divided and the drive elements 30 (see FIGS. 2A to 3B) that drive the mirror 50 are formed in the positions where the drive elements overlap with the mirrors 50 in planar view. In the present embodiment, the first metal portion 71 including metal convex portions is formed on the one surface 10s of the first wafer 10 in a frame shape for each region where the element substrates 1 are divided. For example, as shown in FIG. 5A and FIG. 6, the mirrors 50 and the terminals 17 are formed on the one surface 10s (the first surface) of the first large-sized wafer 10 (the silicon wafer) from which the plurality of substrates 1 can be obtained for each region where the element substrates 1 are divided, and the drive elements 30 (see FIGS. 2A to 3B) that drive the mirrors 50 in the positions where the drive elements overlap with the mirrors 50 in the planar view. The first metal portion 71 including the metal convex portions is formed on the one surface 10s of the first wafer 10 in the frame shape for each region where the element substrates 1 are divided. For example, a copper paste is coated in order to form the first metal portion 71.

As shown in FIG. 5A, in a second wafer forming process, concave portions 21 are formed on one surface 20s of a second large-sized light-transmitting wafer 20 (a glass wafer) from which a plurality of light-transmitting covers 25 can be obtained for each region where the light-transmitting cover 25 is divided. A groove 22 is formed between the neighboring concave portions 21. In order to form the concave portions 21 and the grooves 22, dry etching or wet etching using a potassium hydroxide solution is performed while a resist mask is formed on the one surface 20s of the second wafer 20.

Figure 5B:
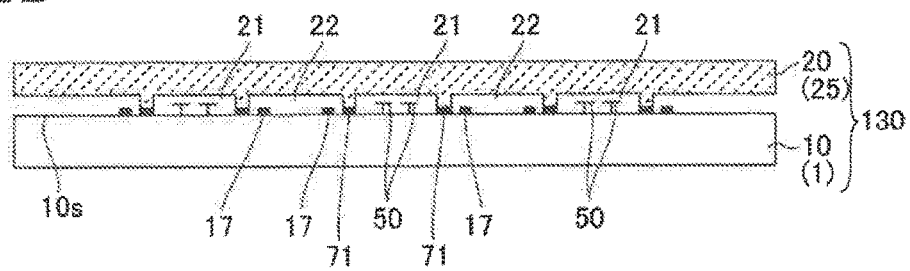

Subsequently, in an adhering process shown in FIG. 5B, the one surface 10s of the first wafer 10 and the one surface 20s of the second wafer 20 overlap with each other such that the concave portions 21 overlap with the mirrors 50 in planar view (for example, planar view when the first wafer 10 is viewed from the one surface 10s), and adhere to each other using a silver paste. More specifically, the one surface 10s of the first wafer 10 adheres to the first metal portion 71 formed on the second wafer 20 such that the concave portions 21 overlap with the mirrors 50 in the planar view (for example, the first wafer 10 is viewed from the one surface 10s). As a result, the first metal portion 71 is in contact with the first wafer 10 (the element substrate 1) and the second wafer 20 (the light-transmitting cover 25). The mirrors 50 are positioned between the first wafer 10 (the element substrate 1) and the second wafer 20 (the light-transmitting cover 25) (an arranging process).

Figure 5C:
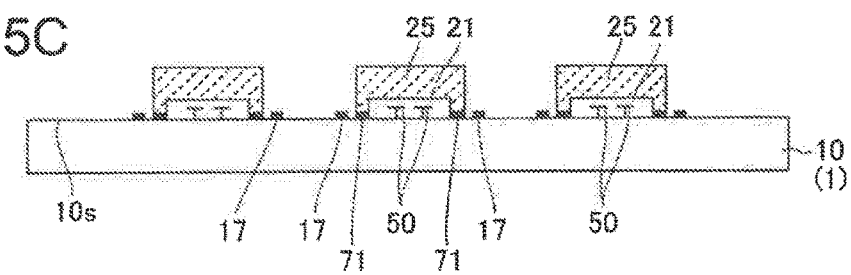
Figure 5D:
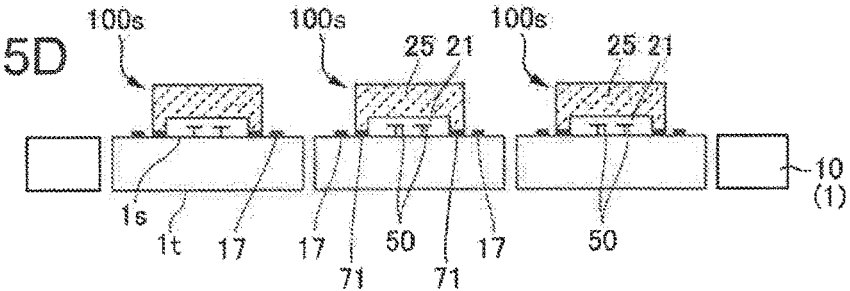

Thereafter, in a dividing process shown in FIGS. 5C and 5D, unit-sized laminated bodies 100s are obtained by dividing a laminated body 130 of the first wafer 10 and the second wafer 20 and fixing the light-transmitting cover 25 to the element substrate 1 including the mirrors 50 so as to overlap with the element substrate.

In the dividing process, the second wafer 20 is divided by allowing a dicing blade (not shown) to enter the second wafer 20 until the dicing glade arrives at the grooves 22 from a side opposite to the first wafer 10 in a second wafer dicing process. Subsequently, in the dividing process, the first wafer 10 is cut by allowing a dicing blade (not shown) to enter the first wafer 10 from the second wafer 20 through cut portions of the second wafer 20 in a first wafer dicing process. As a result, a plurality of laminated bodies 100s in which the one surface 1s of the element surface 1 provided with the plurality of mirrors 50 is sealed by the light-transmitting cover 25 is manufactured.

Figure 7A:
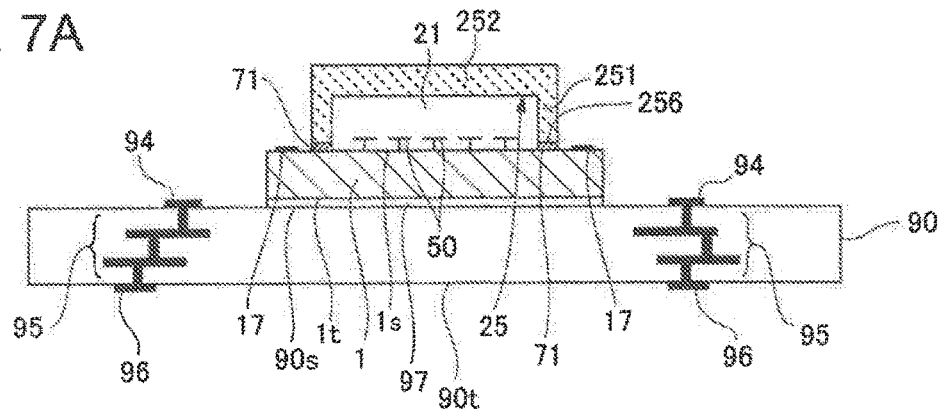
FIGS. 7A to 7C are process sectional views showing a process of mounting an element substrate on a substrate in the method of manufacturing the electro-optical device according to Embodiment 1 of the invention.
Figure 7B:
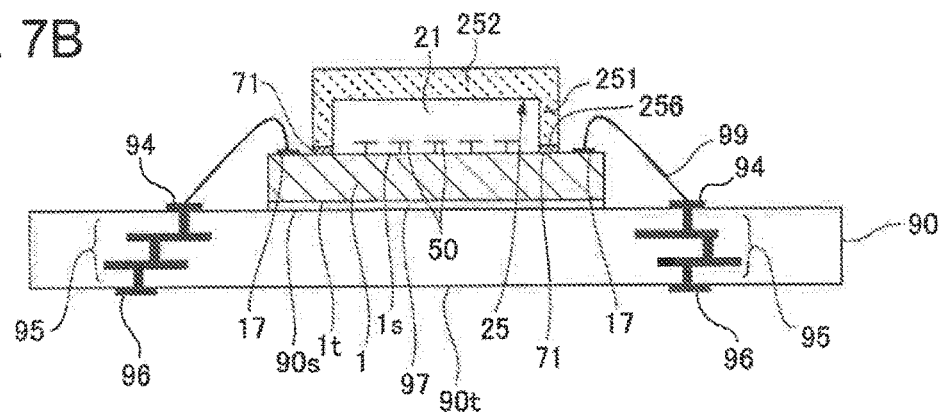
Figure 7C:
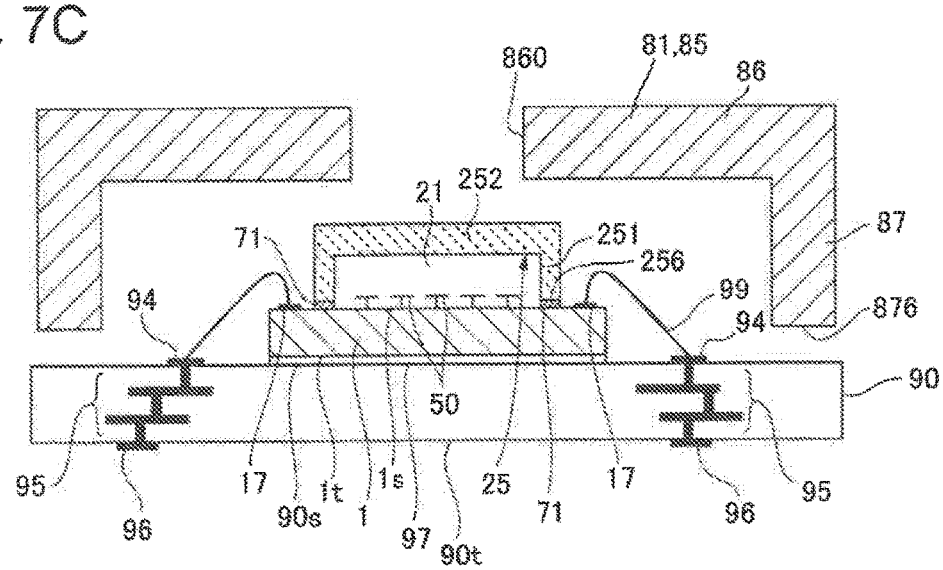

Next, processes shown in FIGS. 7A to 7C are performed. Initially, as shown in FIG. 7A, the element substrate 1 is fixed to the substrate 90 by the adhesive layer 97 made of a silver paste (a mounting process). Subsequently, as shown in FIG. 7B, the terminals 17 of the element substrate 1 and the internal electrodes 94 within the substrate 90 are electrically connected by the wires 99 for wire bonding.

In the subsequent process, as shown in FIG. 7C, the substrate 90 is covered with the metal frame 85 of the second metal portion 81, and the ends 876 of the body portion 87 of the metal frame 85 and the substrate 90 adhere to each other by the adhesive layer made of a silver paste as shown in FIGS. 4A and 4B. The periphery of the opening 860 of the end plate portion 86 of the light-transmitting cover 25 adheres to the end of the light-transmitting cover 25 by the adhesive layer 101 made of a silver paste. As a result, the electro-optical device 100 is finished by bringing the second metal portion 81 (the metal frame 85) into contact with the substrate 90 and the light-transmitting cover 25.

Embodiment 2

Figure 8:
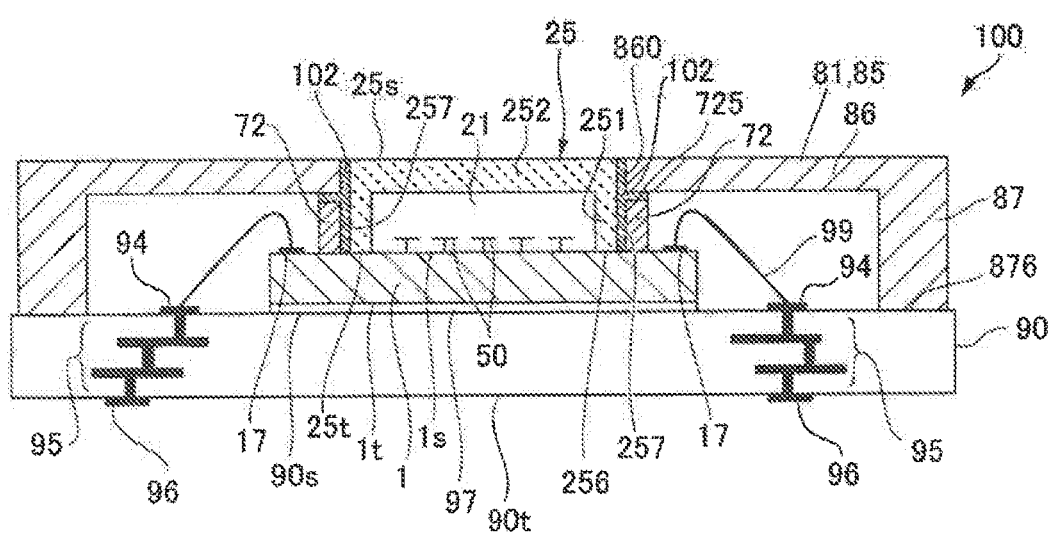
FIG. 8 is a sectional view of an electro-optical device according to Embodiment 2 of the invention.

FIG. 8 is a sectional view of an electro-optical device 100 according to Embodiment 2 of the invention. FIGS. 9A to 9D are process sectional views showing a method of manufacturing the electro-optical device 100 according to Embodiment 2 of the invention. FIGS. 10A to 10C are process sectional views showing a process of mounting an element substrate 1 on a substrate 90 in the method of manufacturing the electro-optical device 100 according to Embodiment 2 of the invention. Since a basic configuration of the present embodiment is the same as that of Embodiment 1, common portions will be assigned the same reference numerals, and thus, the description thereof will be omitted.

Similarly to Embodiment 1, as shown in FIG. 8, in the electro-optical device 100 of the present embodiment, the element substrate 1 in which a plurality of mirrors 50 is formed on one surface 1s is mounted on a mounting surface 90s of the substrate 90 made from a ceramic substrate through an adhesive layer 97 made of a silver paste after the one surface 1s is sealed by a light-transmitting cover 25. In the light-transmitting cover 25, a frame portion 251 and a flat plate portion 252 are integrally formed.

In the electro-optical device 100 having the aforementioned configuration, ends 256 of the frame portion 251 of the light-transmitting cover 25 adhere to the element substrate 1. In the present embodiment, first metal portion 72 formed along lateral surfaces 257 (in other words, the lateral surfaces 257 that connect a surface 25t of the light-transmitting cover 25 facing the element surface 1 to a surface 25s opposite to the surface) positioned on a side of the light-transmitting cover 25 opposite to the mirrors 50 are formed between terminals 17 and the frame portion 251 of the light-transmitting cover 25. The first metal portion 72 is in contact with a lateral surface of the frame portion 251 among the lateral surface 257 of the light-transmitting cover 25, and are contact with the one surface 1s of the element substrate 1. Here, the first metal portion 72 is formed in a frame shape over the entire circumference along the lateral surfaces 257 of the light-transmitting cover 25, and surround the periphery of the region where the mirrors 50 are arranged. For this reason, the first metal portion 72 is in contact with the ends 256 of the frame portion 251 and the lateral surfaces 257 of the light-transmitting cover 25 and the element substrate 1 over the entire circumference.

The first metal portion 72 is, for example, metal portions formed on the element surface 1, and in this case, an adhesive layer 102 is formed between the first metal portion 72 and the lateral surfaces 257 of the light-transmitting cover 25. For example, a silver paste may be used as the adhesive layer 102. As will be described with reference to FIGS. 11A to 11Dd, the first metal portion 72 may be metal portions formed on the light-transmitting cover 25 in some cases, and in this case, the element substrate 1 adheres to the first metal portion 72 by an adhesive layer. In this case, when there are gaps between the first metal portion 72 and the lateral surfaces 257 of the light-transmitting cover 25, the adhesive layer 102 is formed in the gap. In the present embodiment, the first metal portion 72 is metal portions formed on the element substrate 1.

In the electro-optical device 100 of the present embodiment, a second metal portion 81 in contact with the substrate 90 and the light-transmitting cover 25 is formed. Similarly to Embodiment 1, in the present embodiment, the second metal portion 81 is a metal frame 85, and ends 876 of a body portion 87 close to the substrate 90 adhere to the substrate 90 by an adhesive layer. Accordingly, the second metal portion 81 (the metal frame 85) is in contact with the substrate 90. For example, a silver paste may be used as the adhesive layer.

Here, the flat plate portion 252 of the light-transmitting cover 25 is fitted to the opening 860 of the end plate portion 86, and a lateral surface of the flat plate portion 252 among the lateral surfaces 257 of the light-transmitting cover 25 adheres to the inner surface of the opening 860 by the adhesive layer 102 made of a silver paste. Accordingly, the second metal portion 81 (the metal frame 85) is in contact with the light-transmitting cover 25.

End 725 of the first metal portion 72 opposite to the element substrate 1 adheres to the periphery of the opening 860 of the end plate portion 86 through the adhesive layer 102, and the second metal portion 81 (the metal frame 85) is also in contact with the first metal portion 72.

In the electro-optical device 100 having the aforementioned configuration, since the first metal portion 72 in contact with the light-transmitting cover 25 and the element substrate 1 are formed, it is possible to more efficiently release the heat of the light-transmitting cover 25 through the first metal portion 72, the element substrate 1 and the substrate 90. Since the second metal portion 81 in contact with the substrate 90 and the light-transmitting cover 25 is formed in the electro-optical device 100, it is possible to more efficiently release the heat of the light-transmitting cover 25 to the substrate 90 through the second metal portion 81. Since the second metal portion 81 (the metal frame 85) is also in contact with the first metal portion 72, it is possible to release the heat to the second metal portion 81 from the first metal portion 72, and it is possible to release the heat to the first metal portion 72 from the second metal portion 81. Accordingly, since the temperature rise of the electro-optical device 100 can be suppressed, it is possible to suppress the malfunction or the life reduction of the electro-optical device 100.

The mirrors 50 are sealed by the light-transmitting cover 25 and the element substrate 1. The metal frame 85 seals the inside. In the light-transmitting cover 25, the frame portion 251 and the flat plate portion 252 are integrally formed. For this reason, it is possible to prevent moisture from infiltrating into the space where the mirrors 50 are arranged.

Figure 9A:
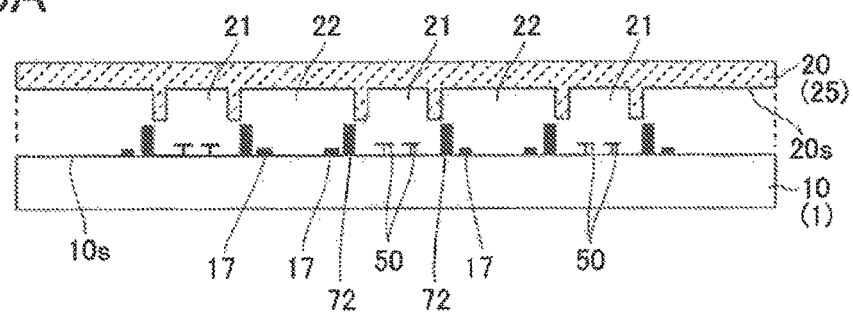
FIGS. 9A to 9D are process sectional views showing a method of manufacturing the electro-optical device according to Embodiment 2 of the invention.
Figure 10A:
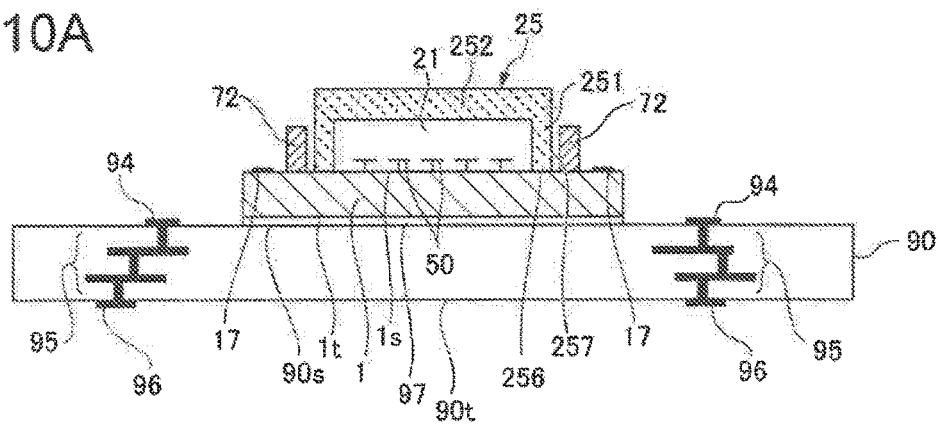
FIGS. 10A to 10C are process sectional views showing a process of mounting an element substrate on a substrate in the method of manufacturing the electro-optical device according to Embodiment 2 of the invention.
Figure 10B:
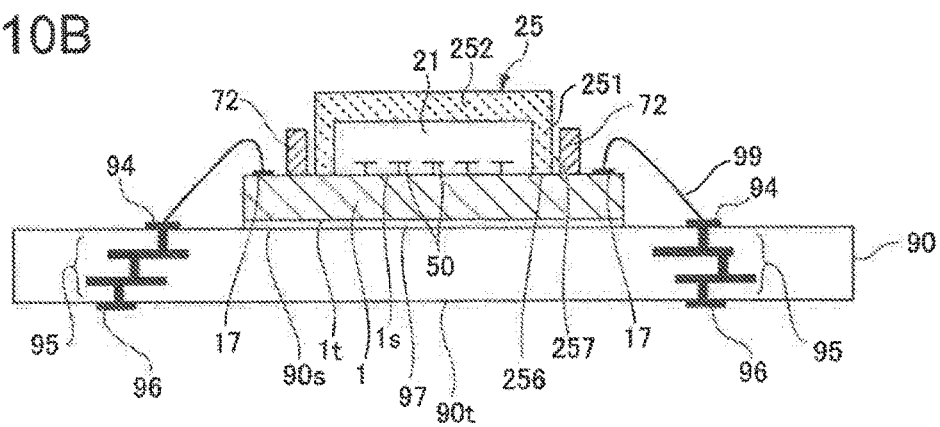
Figure 10C:
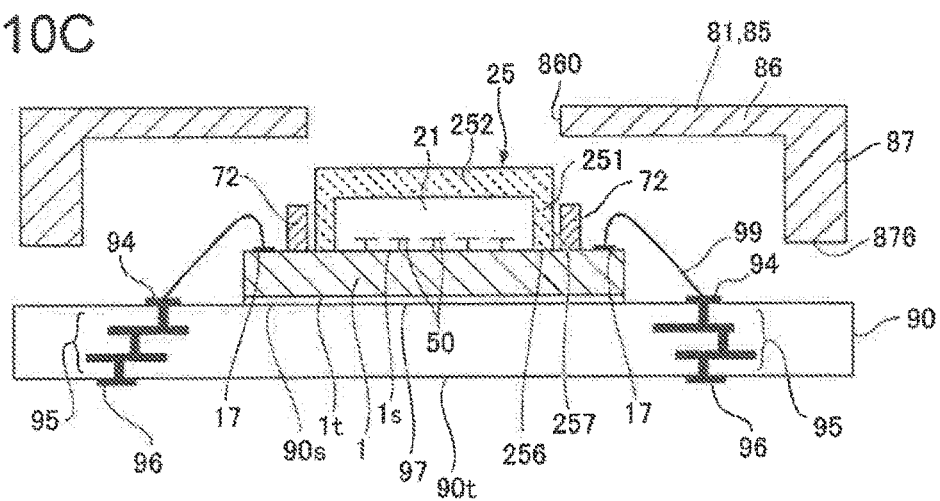

In order to manufacture the electro-optical device 100 having the aforementioned configuration, as shown in FIG. 9A, in a first wafer preparing process, the mirrors 50 and the terminals 17 are formed on one surface 10s of a first large-sized wafer 10 (the silicon wafer) from which a plurality of element substrates 1 can be obtained for each region where the element substrates 1 are divided. In the present embodiment, the first metal portion 72 is formed on the one surface 10s of the first wafer 10 in the frame shape between the terminals 17 and the mirrors 50. For example, a copper paste is coated in order to form the first metal portion 72.

As shown in FIG. 9A, in a second wafer forming process, concave portions 21 and grooves 22 are formed on one surface 20s of a second large-sized light-transmitting wafer 20 (a glass wafer) from which a plurality of light-transmitting covers 25 can be obtained.

Figure 9B:
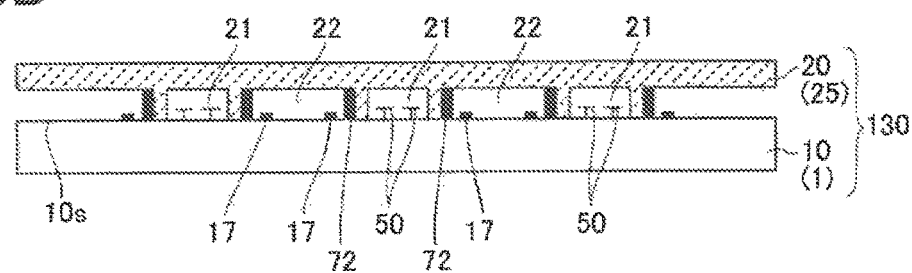

Subsequently, in an adhering process shown in FIG. 9B, the one surface 10s of the first wafer 10 and the one surface 20s of the second wafer 20 overlap with each other and adhere to each other such that the concave portions 21 overlap with the mirrors 50 in planar view (for example, planar view when the first wafer 10 is viewed from the one surface 1s). In this case, the first metal portion 72 and the lateral surfaces of the grooves 22 of the first wafer 10 adhere to each other through the adhesive layer 102. As a result, the first metal portion 72 is in contact with the first wafer 10 (the element substrate 1) and the second wafer 20 (the light-transmitting cover 25) (an arranging process).

Figure 9C:
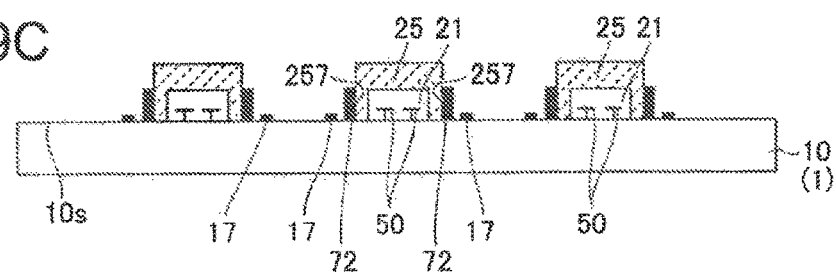
Figure 9D:
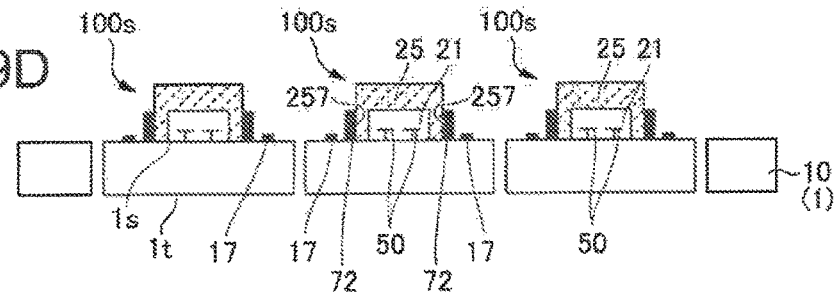

Thereafter, in a dividing process shown in FIGS. 9C and 9D, unit-sized laminated bodies 100s are obtained by dividing a laminated body 130 of the first wafer 10 and the second wafer 20 and fixing the light-transmitting cover 25 to the element substrate 1 including the mirrors 50 so as to overlap with the element substrate.

Subsequently, as shown in FIG. 10A, the element substrate 1 is fixed to the substrate 90 by an adhesive layer 97 made of a silver paste (a mounting process). Thereafter, as shown in FIG. 10B, the terminals 17 of the element substrate 1 and internal electrodes 94 within the substrate 90 are electrically connected by wires 99 for wire bonding.

In the subsequent process, as shown in FIG. 10C, the metal frame 85 of the second metal portion 81 covers the substrate 90, and the ends 876 of the body portion 87 of the metal frame 85 and the substrate 90 adhere by an adhesive layer made of a silver paste as shown in FIG. 8. The inner surface of the opening 860 of the end plate portion 86 of the metal frame 85 adheres to the lateral surfaces 257 of the light-transmitting cover 25 by the adhesive layer 102 made of a silver paste. In this case, the end plate portion 86 of the metal frame 85 and the end 725 of the first metal portion 72 opposite to the element substrate 1 adhere by the adhesive layer 102. Accordingly, when the substrate 90 is in contact with the second metal portion 81, the first metal portion 72 is in contact with the second metal portion 81. As a result, the electro-optical device 100 is finished by bringing the second metal portion 81 (the metal frame 85) into contact with the substrate 90, the light-transmitting cover 25 and the first metal portion 72.

Another Method of Manufacturing Electro-Optical Device 100

Figure 11A:
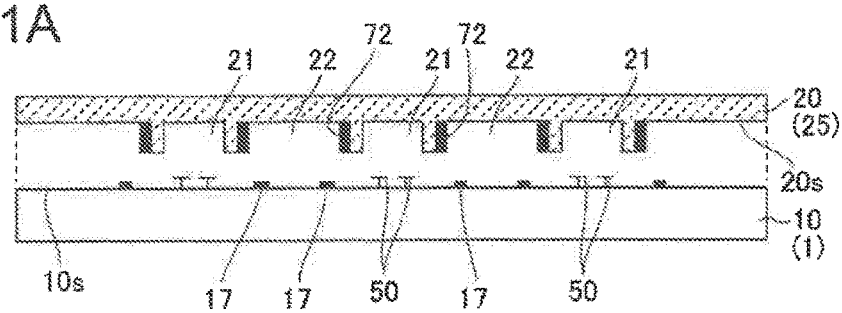
FIGS. 11A to 11D are process sectional views showing another method of manufacturing the electro-optical device according to Embodiment 2 of the invention.

FIGS. 11A to 11D are process sectional views showing another method of manufacturing the electro-optical device 100 according to Embodiment 2 of the invention. Although it has been described in Embodiment 2 that the first metal portion 72 is formed on the first wafer 10 (the element substrate 1), the first metal portion 72 may be formed on the second wafer 20 (the light-transmitting cover 25). More specifically, as shown in FIG. 11A, in a first wafer preparing process, mirrors 50 and terminals 17 are formed on one surface 10s of a first large-sized wafer 10 (the element substrate 1) from which a plurality of element substrates 1 can be obtained for each region where the element substrates 1 are divided.

As shown in FIG. 11A, in a second wafer forming process, concave portions 21 and grooves 22 are formed on one surface 20s of a second large-sized light-transmitting wafer (the light-transmitting cover 25) from which a light-transmitting covers 25 can be obtained. In the present embodiment, the first metal portion 72 is formed on the inner surface of the grooves 22 of the second wafer 20 in the frame shape. For example, a copper paste is coated in order to form the first metal portion 72.

Figure 11B:
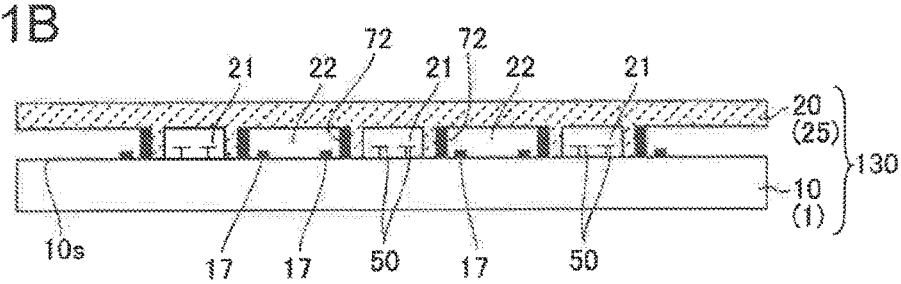
Figure 11C:
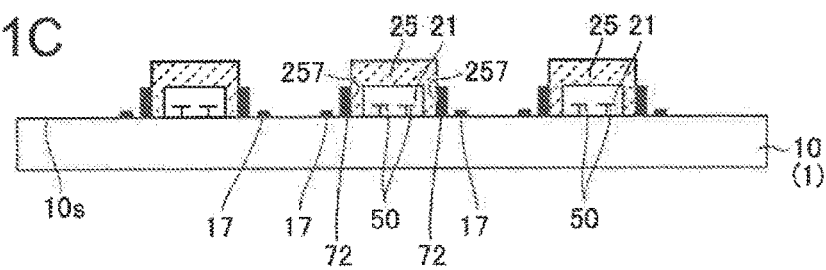
Figure 11D:
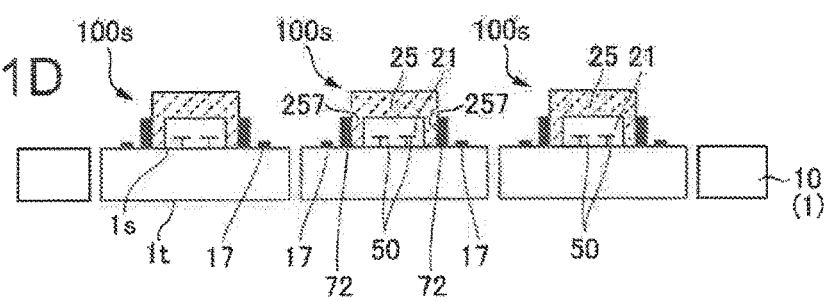

Subsequently, after the one surface 10s of the first wafer 10 and the one surface 20s of the second wafer 20 overlap with each other and adhere to each other such that the concave portions 21 overlap with the mirrors 50 in the planar view in an adhering process shown in FIG. 11B, unit-sized laminated bodies 100s are obtained by dividing the laminated body 130 of the first wafer 10 and the second wafer 20 and fixing the light-transmitting cover 25 to the element substrate 1 including the mirrors 50 so as to overlap with the element substrate in a dividing process shown in FIG. 11C and FIG. 11D. If the processes shown in FIG. 10A to 10C are equally performed in the subsequent processes, it is possible to obtain the electro-optical device 100. However, in the present embodiment, the first metal portion 72 is formed close to the second wafer 20 (the light-transmitting cover 25), the first metal portion 72 and the element substrate 1 adhere to each other by the adhesive layer such as a silver paste in the adhering process.

Embodiment 3

Figure 12:
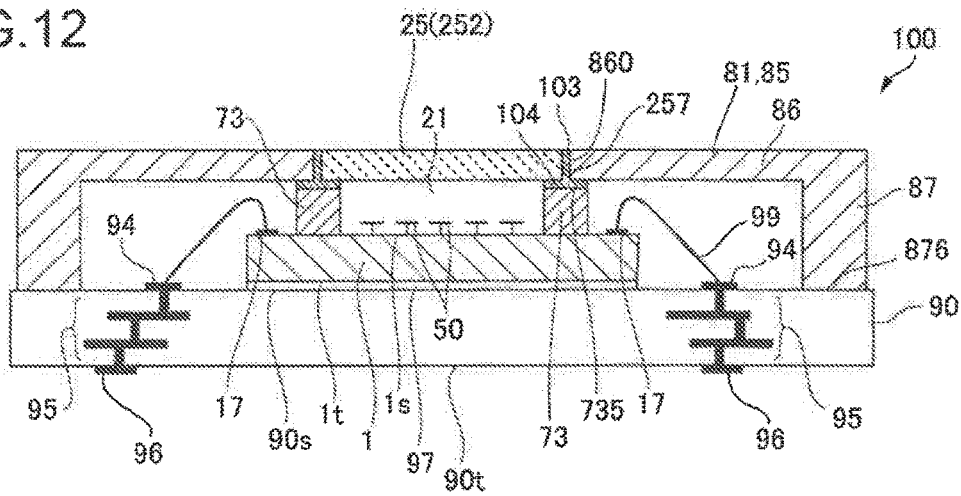
FIG. 12 is a sectional view of an electro-optical device according to Embodiment 3 of the invention.
Figure 13A:
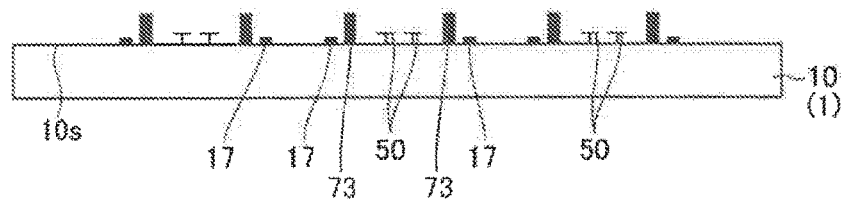
FIGS. 13A and 13B are process sectional views showing a method of manufacturing the electro-optical device according to Embodiment 3 of the invention.
Figure 13B:
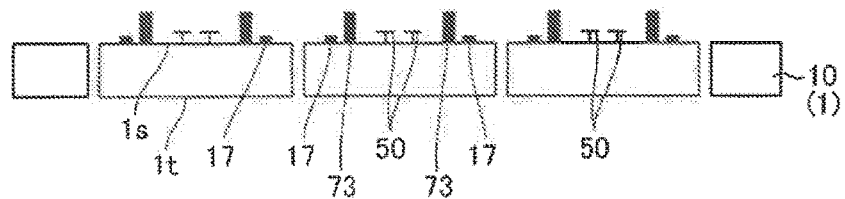
Figure 14A:
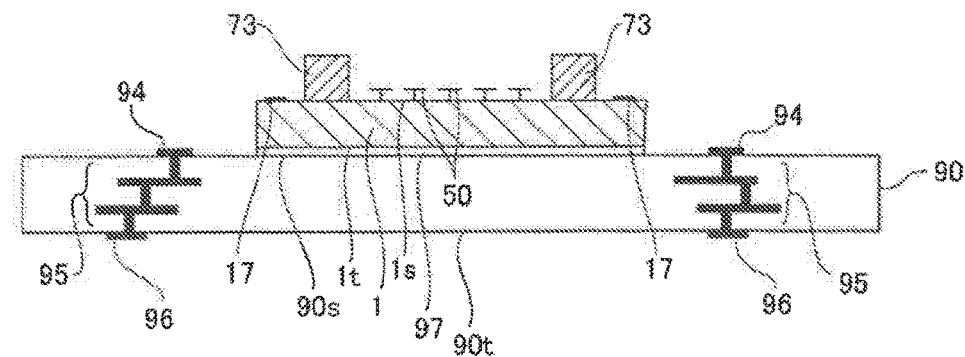
FIGS. 14A to 14C are process sectional views showing a process of mounting an element substrate on a substrate in the electro-optical device according to Embodiment 3 of the invention.
Figure 14B:
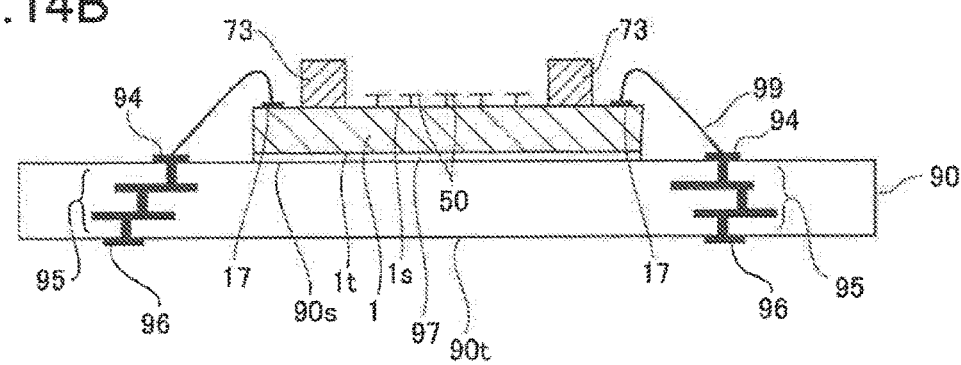
Figure 14C:
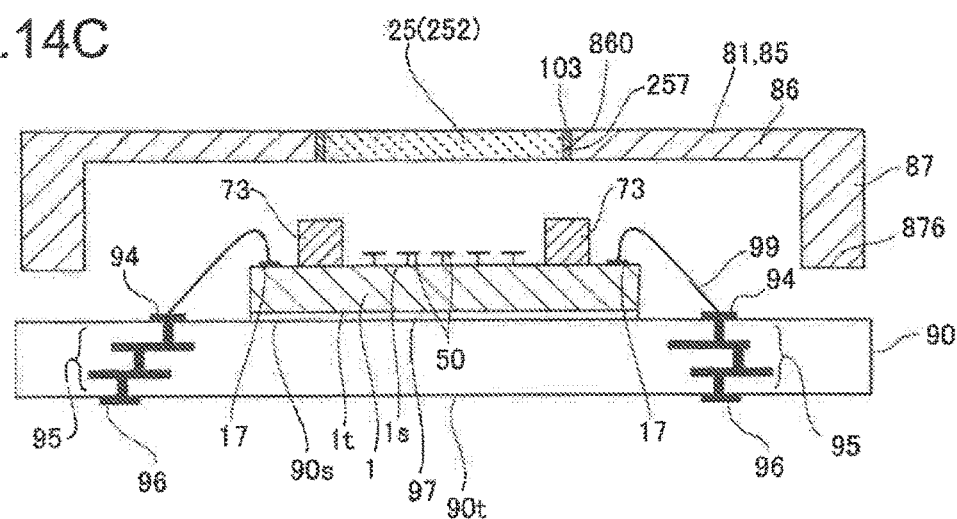

FIG. 12 is a sectional view of an electro-optical device 100 according to Embodiment 3 of the invention. FIGS. 13A and 13B are process sectional views showing a method of manufacturing the electro-optical device 100 according to Embodiment 3 of the invention. FIGS. 14A to 14C are process sectional views showing a process of mounting an element substrate 1 on a substrate 90 in the electro-optical device 100 according to Embodiment 3 of the invention. Since a basic configuration of the present embodiment is the same as that of Embodiment 1, common portions will be assigned the same reference numerals, and thus, the description thereof will be omitted.

Similarly to Embodiment 1, as shown in FIG. 12, in the electro-optical device 100 of the present embodiment, one surface 1s of the element substrate 1 in which a plurality of mirrors 50 is formed on one surface 1s is sealed by a light-transmitting cover 25. The element substrate 1 is mounted on a mounting surface 90s of the substrate 90 made from a ceramic substrate through an adhesive layer 97 made of a silver paste.

In the electro-optical device 100 having the aforementioned configuration, the light-transmitting cover 25 has a plate shape, and includes only a flat plate portion 252. In the present embodiment, first frame-shaped metal portion 73 is formed on one surface 1s of the element substrate 1 between the mirrors 50 and terminals 17 so as to surround the periphery of a region where the mirrors 50 are provided in planar view (for example, planar view when the element substrate 1 is viewed from the one surface 1s). In the present embodiment, an end 735 of the first metal portion 73 opposite to the element substrate 1 adheres to the light-transmitting cover 25 by an adhesive layer 104 made of a silver paste, and the first metal portions function as spacers which hold the light-transmitting cover 25 in positions separated from the element substrate 1. For this reason, the first metal portion 73 is in contact with the light-transmitting cover 25 and the element substrate 1 over the entire circumference.

In the electro-optical device 100 of the present embodiment, a second metal portion 81 in contact with the substrate 90 and the light-transmitting cover 25 is formed. Similarly to Embodiment 1, in the present embodiment, the second metal portion 81 is a metal frame 85. Ends 876 of a body portion 87 of the metal frame 85 close to the substrate 90 adhere to the substrate 90 through an adhesive layer. Accordingly, the metal frame 85 is in contact with the substrate 90. For example, a silver paste may be used as the adhesive layer.

Here, the light-transmitting cover 25 is fitted to an opening 860 of an end plate portion 86, and lateral surfaces 257 of the light-transmitting cover 25 adhere to the inner surfaces of the opening 860 by an adhesive layer 103 made of a silver paste. Accordingly, the second metal portion 81 (the metal frame 85) is in contact with the light-transmitting cover 25.

End 735 of the first metal portion 73 opposite to the element substrate 1 adheres to the periphery of the opening 860 of the end plate portion 86 through the adhesive layer 104, and the second metal portion 81 (the metal frame 85) is in contact with the first metal portion 73.

In the electro-optical device 100 having the aforementioned configuration, since the first metal portion 73 in contact with the light-transmitting cover 25 and the element substrate 1 is formed, it is possible to more efficiently release the heat of the light-transmitting cover 25 through the first metal portion 73, the element substrate 1 and the substrate 90. In the electro-optical device 100, since the second metal portion 81 in contact with the substrate 90 and the light-transmitting cover 25 are formed, it is possible to more efficiently release the heat of the light-transmitting cover 25 to the substrate 90 through the second metal portion 81. Since the second metal portion 81 (the metal frame 85) is in contact with the first metal portion 73, it is possible to release the heat to the second metal portion 81 from the first metal portion 73, and it is possible to release the heat to the first metal portion 73 from the second metal portion 81. Accordingly, since the temperature rise of the electro-optical device 100 can be suppressed, it is possible to suppress the malfunction or the life reduction of the electro-optical device 100.

The mirrors 50 are sealed by the light-transmitting cover 25, the first metal portion 73 and the element substrate 1. The metal frame 85 seals the inside. For this reason, it is possible to prevent moisture from infiltrating into a space where the mirrors 50 are arranged.

In order to manufacture the electro-optical device 100 having the aforementioned configuration, as shown in FIG. 13A, in a first wafer preparing process, mirrors 50 and terminals 17 are formed on one surface 10s of a first large-sized wafer 10 (a silicon wafer) from which a plurality of element substrates 1 can be obtained for each region where the element substrates 1 are divided. In the present embodiment, first metal portion 73 is formed on one surface 10s of the first wafer 10 between the terminals 17 and the mirrors 50 in a frame shape. For example, a copper paste is formed in order to form the first metal portion 73.

Subsequently, as shown in FIG. 13B, the first wafer 10 is divided into unit-sized element substrates 1 by a dicing blade (not shown).

Thereafter, as shown in FIG. 14A, the element substrate 1 is fixed to the substrate 90 by an adhesive layer 97 made of a silver paste. Subsequently, as shown in FIG. 14B, the terminals 17 of the element substrate 1 and the inner electrodes 94 of the substrate 90 are electrically connected by the wires 99 for wire bonding (a mounting process).

Subsequently, the light-transmitting cover 25 which is integrally formed with the second metal portion 81 (the metal frame 85) covers the substrate 90 by the adhesive layer 103 as shown in FIG. 14C, and the substrate 90 and the ends 876 of the body portion 87 of the metal frame 85 adhere to each other by the adhesive layer made of a silver paste as shown in FIG. 12. The light-transmitting cover 25 and the end 735 of the first metal portion 73 opposite to the element substrate 1 adhere to each other by the adhesive layer 104 (an arranging process). In this case, the periphery of the opening 860 of the end plate portion 86 of the metal frame 85 and the end 735 of the first metal portion 73 opposite to the element substrate 1 adheres to each other by the adhesive layer 104. Accordingly, when the substrate 90 is in contact with the second metal portion 81, the first metal portion 73 and the second metal portion 81 are in contact with each other. As a result, the electro-optical device 100 is finished by bringing the second metal portion 81 (the metal frame 85)

into contact with the substrate 90, the light-transmitting cover 25 and the first metal portion 73.

Another Configuration Example of First Metal Portion 73

Figure 15:
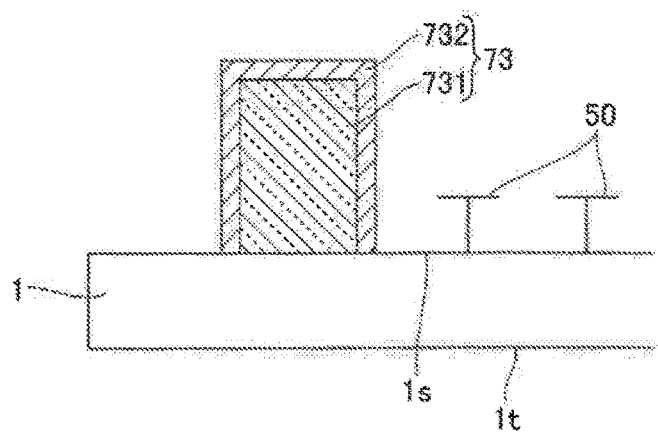
FIG. 15 is a sectional view showing another configuration example of a first metal portion used in the electro-optical device according to Embodiment 3 of the invention.

FIG. 15 is a sectional view showing another configuration example of the first metal portion 73 used in the electro-optical device 100 according to Embodiment 3 of the invention. Although it has been described in Embodiment 3 that the first metal portion 73 is formed by coating the copper paste, the first metal portion 73 may be formed using a metal layer 732 surrounding a resin portion 731 protruding from the one surface 1s of the element substrate 1, as shown in FIG. 15. Such a configuration can be realized in such a manner that the resin portion 731 is formed, the metal layer 732 is plated, and the metal layer 732 is formed.

The configuration shown in FIG. 15 is not limited to the first metal portion 73 described in Embodiment 3, but may use the first metal portions 71 and 72 described in Embodiments 1 and 2.

Embodiment 4

Figure 16:
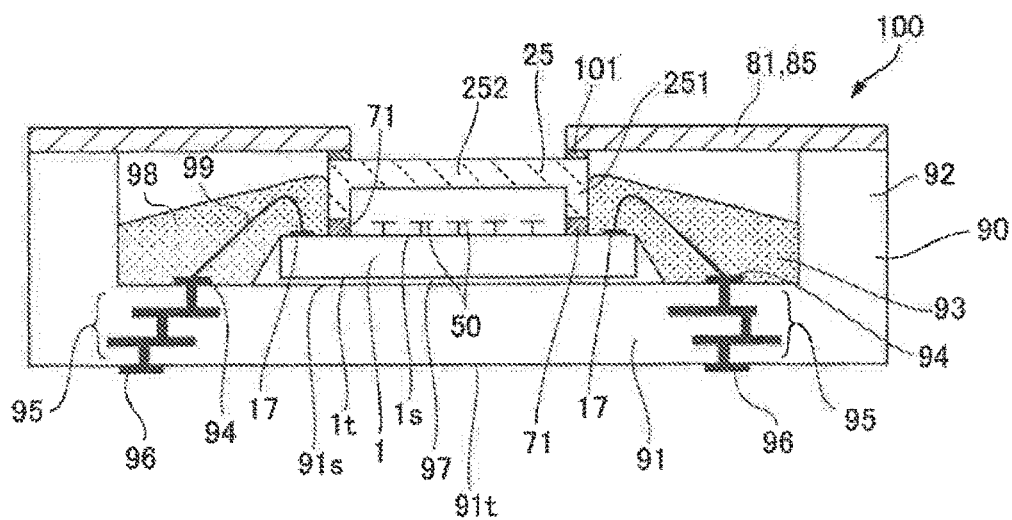
FIG. 16 is a sectional view of an electro-optical device according to Embodiment 4 of the invention.

FIG. 16 is a sectional view of an electro-optical device 100 according to Embodiment 4 of the invention. Since a basic configuration of the invention is the same as that of Embodiment 1, common portions will be assigned the same reference numerals, and thus, the description thereof will be omitted. Similarly to Embodiment 1, in the present embodiment, as shown in FIG. 16, first metal portion 71 and a second metal portion 81 (a metal frame 85) are formed. Here, the metal frame 85 is a flat plate shape, and is fixed to a sidewall 92 protruding from a bottom plate 91 of a substrate 90 by an adhesive layer. Accordingly, the second metal portion 81 (the metal frame 85) is in contact with the sidewall 92 of the substrate 90. In the present embodiment, a sealing resin 98 is provided between the bottom plate 91 of the substrate 90 and the metal frame 85. The sealing resin 98 surrounds the periphery of the light-transmitting cover 25 and the element substrate 1, and is in contact with the lateral surfaces of the element substrate 1 and the lateral surfaces of the light-transmitting cover 25. Accordingly, in the present embodiment, it is possible to release the heat of the light-transmitting cover 25 to the substrate 90 through the sealing resin 98, and it is possible to prevent moisture from infiltrating into a space where the mirrors 50 are arranged by the sealing resin 98. Although it has been described in the present embodiment that the sealing resin 98 is added to Embodiment 1, the sealing resin may be added to Embodiment 2 or 3.

Embodiment 5

Figure 17:
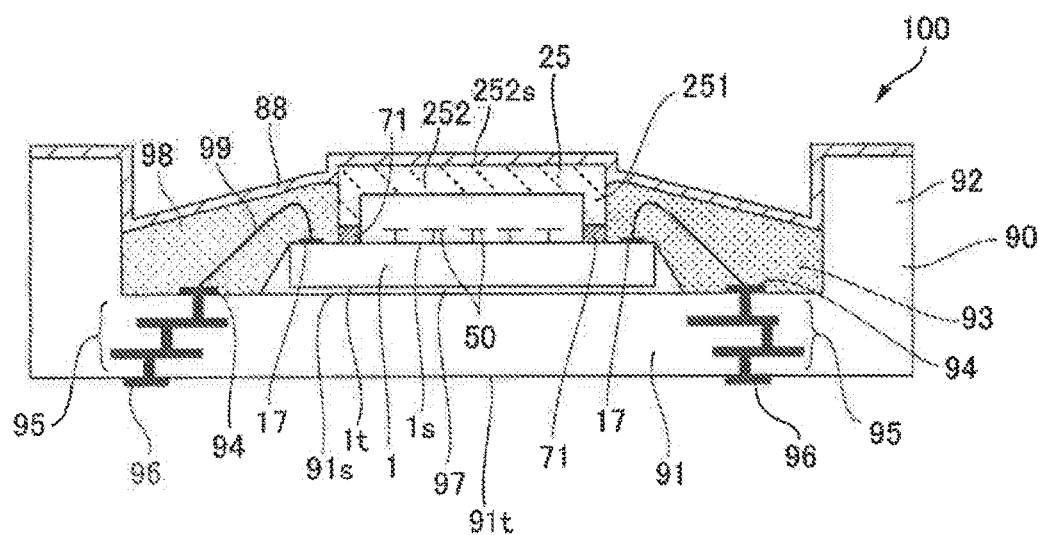
FIG. 17 is a sectional view of an electro-optical device according to Embodiment 5 of the invention.
Figure 18:
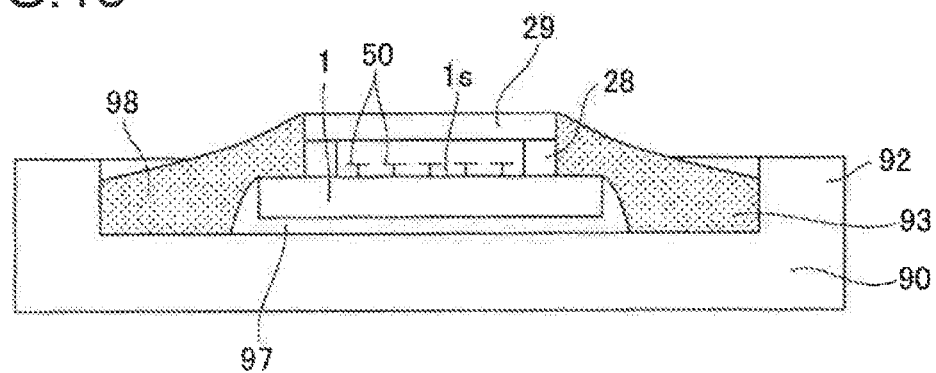
FIG. 18 is a sectional view of an electro-optical device according to a reference example of the invention.

FIG. 17 is a sectional view of an electro-optical device 100 according to Embodiment 5 of the invention. Since a basic configuration of the present embodiment is the same as that of Embodiment 1, common portions will be assigned the same reference numerals, and thus, the description thereof will be omitted. Similarly to Embodiment 1, as shown in FIG. 17, in the present embodiment, an element substrate 1 is mounted on a substrate 90, and is provided with first metal portion 71. Here, a sealing resin 98 in contact with the lateral surfaces of the element substrate 1 and the lateral surfaces of a light-transmitting cover 25 is provided in the inside of a sidewall 92 of the substrate 90, and a light-transmitting inorganic material layer 88 in contact with the sidewall 92 of the substrate 90 is laminated on a surface 252s of the light-transmitting cover 25 opposite to a surface facing the mirrors 50 and a surface of the sealing resin 98 opposite to a surface facing the substrate 90.

Here, the light-transmitting inorganic material layer 88 is a metal oxide film such as a silicon oxide film or an ITO film, and has thermal conductivity higher than the sealing resin 98. Accordingly, it is possible to release the heat of the light-transmitting cover 25 to the substrate 90 through the sealing resin 98, and it is possible to radiate the heat through the inorganic material layer 88.

Another Embodiment

It has been described in Embodiments 1, 2, 3 and 4 that the metal frame 85 is used as the second metal portion 81. However, for example, a metal film in contact with the sidewall 92 of the substrate 90 and the lateral surfaces of the light-transmitting cover 25 may be laminated on a surface of the sealing resin 98 opposite to the substrate 90, and the second metal portion 81 may be formed using the metal film, as in Embodiment 5.

Although it has been described in the aforementioned embodiments that the first metal portions 71, 72 and 73 are made of copper, the first metal portions may be made of aluminum. Although it has been described in the aforementioned embodiments that the ceramic substrate is used as the substrate 90, a substrate made of an alloy such as 42 alloy obtained by mixing nickel with iron may be used.

Although it has been described in Embodiments 1 and 2 that the frame portion 251 and the flat plate portion 252 of the light-transmitting cover 25 are integrally formed, the invention may be applied to a case where the frame portion 251 and the flat plate portion 252 are separately formed.

What is claimed is:

1. An electro-optical device comprising:
    a first substrate;
    an element substrate that is mounted on the first substrate, the element substrate being a second substrate;
    a mirror that is provided on a first surface of the element substrate;
    a drive element that is provided on the first surface of the element substrate to drive the mirror;
    a light-transmitting cover that has light transmitting properties, and is provided such that the mirror is positioned between the light-transmitting cover and the element substrate; and
    a metal portion that is a metal frame being in contact with the first substrate and the light-transmitting cover, and includes an end plate portion facing the first substrate, and a square body portion protruding toward the first substrate from an outer periphery of the end plate portion, wherein
    an opening is formed in a position of the end plate portion which overlaps with the light-transmitting cover in planar view, and
    the opening is formed at a surface of the light-transmitting cover that is opposite to a surface of the light-transmitting cover facing the mirror.

2. The electro-optical device according to claim 1, wherein the metal frame is fixed to the light-transmitting cover and the first substrate.

3. The electro-optical device according to claim 1, further comprising:
    a sealing resin that is in contact with a lateral surface of the element substrate and a lateral surface of the light-transmitting cover between the metal portion and the first substrate.

4. An electronic apparatus including the electro-optical device according to claim 1, the device comprising:
a light source unit that applies light-source light to the mirror.

5. An electro-optical device comprising:
a first substrate;
an element substrate that is mounted on the first substrate, the element substrate being a second substrate;
a mirror that is provided on a first surface of the element substrate;
a drive element that is provided on the first surface of the element substrate to drive the mirror;
a light-transmitting cover that has light transmitting properties, and is provided such that the mirror is positioned between the light-transmitting cover and the element substrate;
a sealing resin that is in contact with a lateral surface of the element substrate and a lateral surface of the light-transmitting cover; and
a light-transmitting inorganic material layer that is laminated on at least a part of a surface of the light-transmitting cover opposite to a surface of the light-transmitting cover facing the mirror and a surface of the sealing resin opposite to a surface of the sealing resin facing the first substrate, and is in contact with the first substrate.

6. The electro-optical device according to claim 5, wherein the light-transmitting inorganic material layer is a metal oxide film and has a thermal conductivity higher than the sealing resin.

7. A method of manufacturing an electro-optical device, the method comprising:
providing a light-transmitting cover having light transmitting properties on an element substrate that includes a mirror and a drive element which drives the mirror on a first surface, the mirror being positioned between the light-transmitting cover and the element substrate;
mounting the element substrate on a first substrate, the element substrate being a second substrate; and
forming a metal portion into contact with the light-transmitting cover and the first substrate,
the metal portion being a metal frame and including an end plate portion facing the first substrate, and a square body portion protruding toward the first substrate from an outer periphery of the end plate portion;
forming an opening in a position of the end plate portion which overlaps with the light-transmitting cover in planar view; and
forming the opening at a surface of the light-transmitting cover that is opposite to a surface of the light-transmitting cover facing the mirror.

* * * * *